United States Patent
Palanisamy et al.

[11] Patent Number: 6,154,033
[45] Date of Patent: Nov. 28, 2000

[54] METHOD AND APPARATUS FOR ANALYZING NICKEL-CADMIUM BATTERIES

[75] Inventors: Thirumalai G. Palanisamy, Morristown; Patrick M. Rudai, Clifton, both of N.J.; Steven Hoenig, Staten Island, N.Y.; Harmohan Singh, Rockaway, N.J.

[73] Assignee: Honeywell International Inc., Morristown, N.J.

[21] Appl. No.: 09/481,588

[22] Filed: Jan. 12, 2000

[51] Int. Cl.[7] .......................... G01N 27/42; G01N 27/416
[52] U.S. Cl. ............................ 324/425; 324/430; 324/432
[58] Field of Search .................................. 324/425, 428, 324/430, 432, 433, 434; 320/132

[56] References Cited

U.S. PATENT DOCUMENTS

| | | |
|---|---|---|
| 3,781,657 | 12/1973 | Dennstedt . |
| 3,808,522 | 4/1974 | Sharaf . |
| 4,259,639 | 3/1981 | Renirie . |
| 4,697,134 | 9/1987 | Burkum et al. . |
| 5,841,357 | 11/1998 | Henry et al. . |

*Primary Examiner*—Edward H. Tso
*Attorney, Agent, or Firm*—Loria B. Yeadon

[57] ABSTRACT

A system and method for comprehensive analysis of a multi-cell battery, such as of the nickel-cadmium type, on an individual cell level basis and overall battery basis. For an unsealed battery, which affords access to the individual battery cells, (FIG. 2) tests are carried out to determine the presence of any shorted or reversed cells, and these can be repaired or replaced ((6)–(11)). The individual cells are then tested for sufficient electrolyte on the basis of comparing the cell internal resistance to a maximum internal resistance for the cell and electrolyte added as needed ((12)–(15)). A sealed battery, to which there is no access to the individual cells, is first tested for shorted or reversed cells on a battery level basis ((16)–(19)). A sealed battery that passes this test ((20)–(22)) and an unsealed battery whose individual cells have been found to be satisfactory in its prior tests are subjected to further testing on a battery level basis for: (a) overall internal resistance to determine if it exceeds a given maximum value internal resistance, this indicating that the battery is defective (23); and (b) actual capacity as compared to its rated capacity ((24)–(30)). A battery whose actual capacity is greater than its rated capacity is tested for a memory effect and the memory effect problem is corrected if found to be present ((31)–(36)).

15 Claims, 4 Drawing Sheets

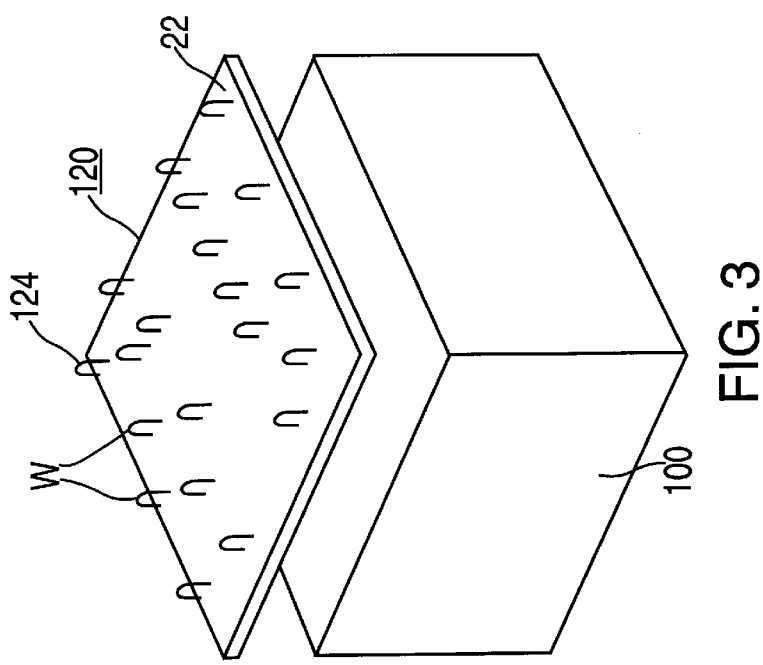
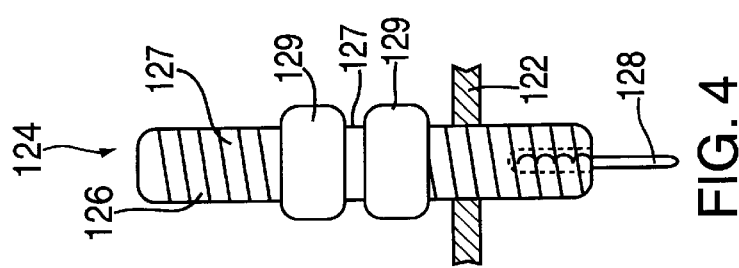
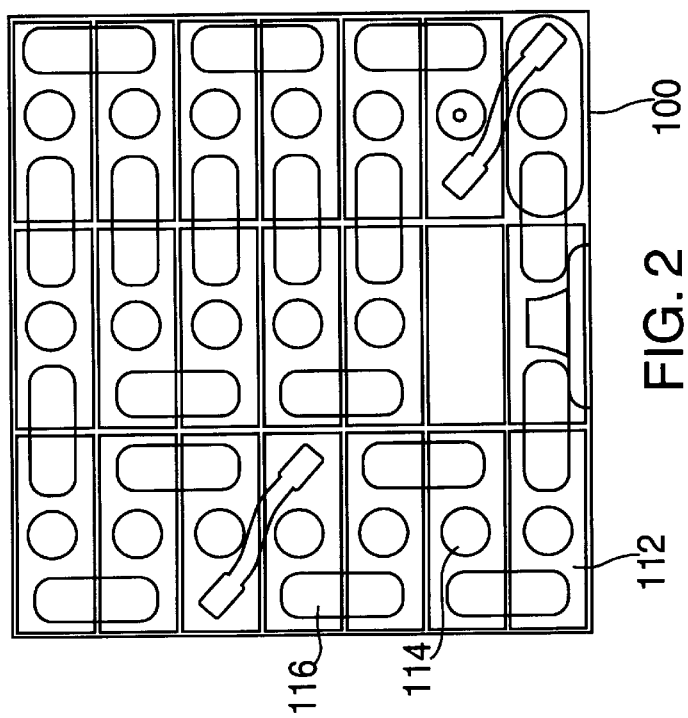

| 5A |
| 5B |

METHOD AND APPARATUS FOR ANALYZING NICKEL-CADMIUM BATTERIES

FIELD OF THE INVENTION

The present invention relates to a method and system for analyzing and charging a battery, such as one of the nickel-cadmium type.

GOVERNMENT STATEMENT

All or part of this invention was developed for the United States Navy under Government Contract No. N00164-96-C-0045. The U.S. Government may have certain rights to this invention under terms of the contract.

BACKGROUND OF THE INVENTION

Presently, the methods and apparatus available for determining the health of Nickel-Cadmium (Ni—Cd) batteries are very limited. Such batteries are often configured of a number of cells, each having a rated nominal open circuit voltage of 1.26V. The cells are connected in series to achieve a desired battery output voltage. Battery capacity is determined by the physical size of the cells and can be increased by connecting cells in parallel. The general method presently in use for determining if such a battery is healthy is to evaluate its performance through a complete charge and discharge cycle.

Batteries are either manufactured as sealed or non-sealed. In a sealed battery, the individual cells are inaccessible for electrical contact, addition of electrolyte or replacement of a defective cell. In the unsealed state, each cell of the battery is accessible for electrical contact, replacement or electrolyte addition.

In general, use of the existing charge/discharge cycle method to test both sealed and unsealed batteries is quite time consuming and is harmful to the overall life of the battery. Accordingly, a need exists to provide a method and system for making the testing of such batteries easier, faster, more efficient and more comprehensive.

BRIEF DESCRIPTION OF THE INVENTION

The present invention is directed to a method and system for performing a comprehensive diagnostic to analyze the health of any sealed or non-sealed Ni—Cd battery. This method and system are capable of detecting a wide variety of defects and will either attempt to repair certain detected defects or instruct the user on how to accomplish this. The diagnostic also has the ability to test individual cells of a non-sealed battery. All diagnostics are performed without discharging the battery, thereby avoiding an adverse affect on its life through unnecessary cycling.

The invention includes a step by step procedure. Preferably, the procedure is carried out under computer control. The procedure first identifies the battery to be tested and then performs a thorough diagnostic in the fastest and most efficient way possible. In particular, for an unsealed battery, which affords access to the individual battery cells, tests are carried out to determine the presence of any shorted or reversed cells, and these can be repaired or replaced. The individual cells are then tested for sufficient electrolyte on the basis of comparing the cell internal resistance to a maximum internal resistance for the cell, and electrolyte is added as needed. A sealed battery, to which there is no access to the individual cells, is first tested for shorted or reversed cells on a battery level basis. A sealed battery that passes this test and an unsealed battery whose individual cells have been found to be satisfactory in its prior tests are subjected to further testing on a battery level basis for: (a) overall internal resistance to determine if it exceeds a given maximum value internal resistance, this indicating that the battery is defective; and (b) actual capacity as compared to its rated capacity. A battery whose actual capacity is greater than its rated capacity is tested for a memory effect and the memory effect problem is corrected if found to be present. If defects are detected, the system will determine if they are repairable and perform all the necessary repairs, or instruct the user on how to do so. The user will then be informed of the battery condition and of any additional steps that need to be taken to repair or preserve the battery.

The method and system are operable with both sealed and unsealed batteries. For a sealed battery the diagnostic operates only on the basis of an overall battery level test. That is, individual battery cells are not tested. In a preferred embodiment for an unsealed battery, a connecting arrangement, described below as a HAT, is provided which permits individual cells of the battery to be accessed for measurement and repair. That is, the battery is analyzed on a cell level basis. An unsealed battery also can be analyzed on an overall battery level basis.

OBJECTS OF THE INVENTION

It is therefore an object of the present invention to provide a method and system for analyzing a Ni—Cd battery.

Another object is to provide a method and system to perform a diagnostic test of a Ni—Cd battery which determines defects and which can effectuate repairs.

A further object is to provide a method and system for performing diagnostic testing of either a sealed or unsealed Ni—Cd battery to determine battery status, determine defects, to automatically repair or advise the user how to repair the defects, or to advise that the battery should be discarded.

An additional object is to provide a method and apparatus for diagnosing an unsealed Ni—Cd battery using a device which provides connections such that the individual state of each cell can be determined automatically, thereby allowing for defect detection and repair on a cell level basis.

BRIEF DESCRIPTION OF THE DRAWINGS

Other objects and advantages of the present invention will become more apparent upon reference to the following specification and annexed drawings in which:

FIG. 2 is a top view of an unsealed Ni—Cd battery;

FIG. 3 is a view of a HAT structure that makes electrical contact with the cells of a battery under test;

FIG. 4 shows the details of one contact terminal of the HAT; and

DETAILED DESCRIPTION OF THE INVENTION

Figure 1:
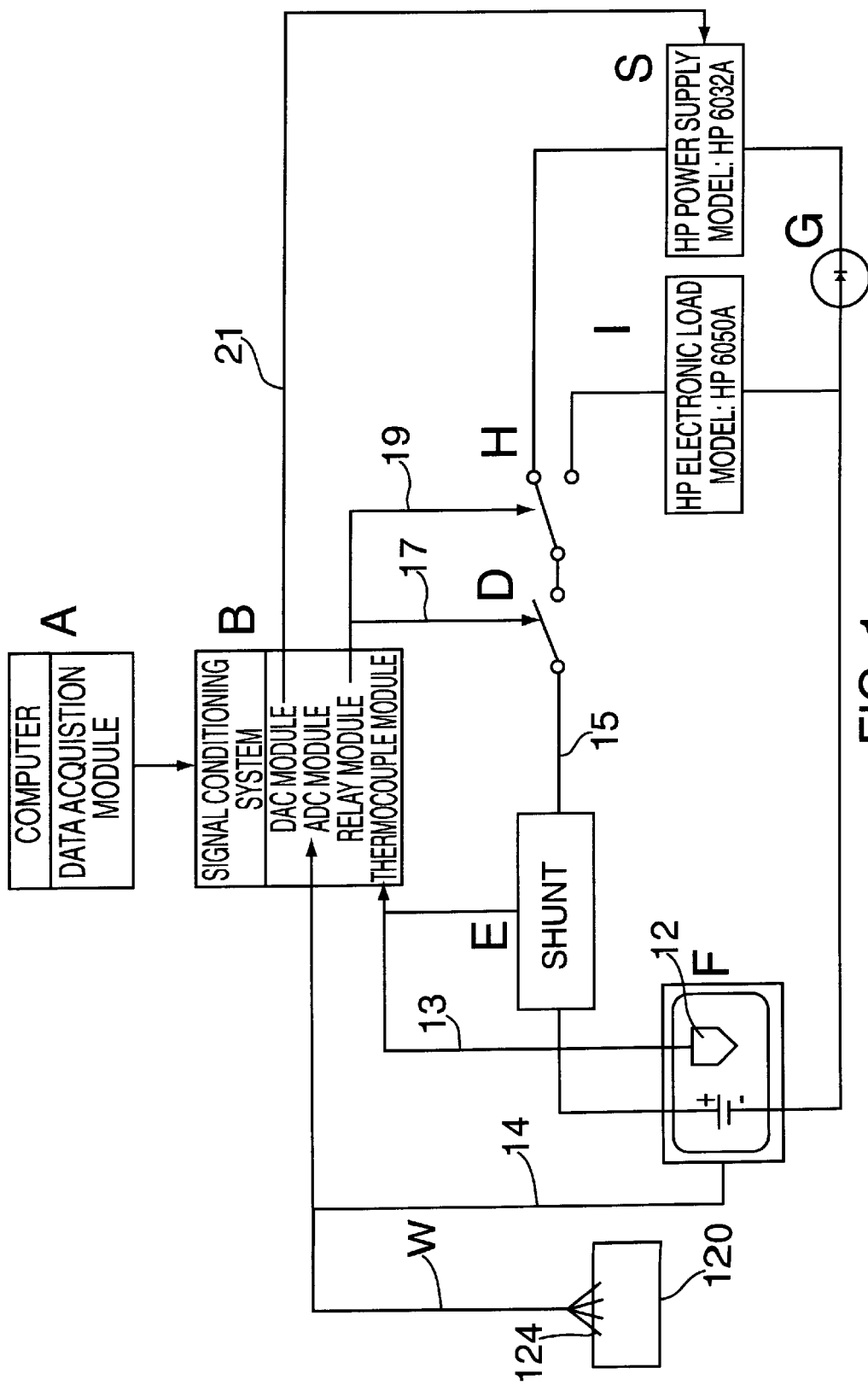
FIG. 1 is a schematic block diagram of the overall system hardware.

FIG. 1 is a diagram of a battery test stand setup in accordance with the invention. A Ni—Cd battery of the type to be tested typically can have one or more cells. For a battery having a number of cells these can be connected in series or parallel to obtain a desired battery output voltage and capacity (current). Here, the term "battery" is used generally to indicate both those of the types having one cell or more than one cell connected in series or in parallel. As described below the invention can be used to test a selected one or more accessible cells of a multi-cell battery by appropriate electrical connection to the battery cell or cells being tested.

The present invention is illustratively described with respect to the testing of Ni—Cd batteries, that is, batteries whose positive and negative plates are of nickel and cadmium, with the plates being immersed in an electrolyte, usually water. However, the principles of the invention can be extended to other types of batteries.

FIG. 1 shows the system used for the analysis and diagnosis of the battery. Basically, a battery to be tested is attached to a computer controlled charging and discharging system. The system can be a stand alone unit or one comprising a current source (power supply), electronic load, computer, data acquisition system and/or a voltmeter.

In FIG. 1, the battery is designated F, with the positive and negative terminals shown by the usual + and − symbols. The battery illustratively is of the multi-cell type but individual cells of the battery and their connections are not shown here. Testing the individual cells of a battery is described below. A thermocouple is mounted on the battery outer casing or immersed in the battery electrolyte to measure the battery temperature. This data is used, as described below.

There is a computer A having any suitable conventional microprocessor or microcontroller that includes data input, e.g., a keyboard, and output, e.g., a printer and/or display. The computer A includes a memory with an application program having the necessary instructions to control the charging and discharging of the battery and to perform various measurement, diagnostic and repair functions, as described below. The program can be embedded in read only memory (ROM). The computer also includes the usual RAM type memory, data processing unit and computational facilities. The computer is also shown as having a data acquisition module (DAQ) which inputs the data from various sources as described below.

Charging current is supplied to the battery F from a programmable variable current (power supply) source S whose output is controllable by analog voltage signals over line 21 from a digital to analog converter (DAC) which is part of a signal conditioning system B associated with computer A. There is also a programmable source I which, as described below, acts as an electronic load to discharge the battery. The sources S and I can be of any conventional types that are controllable by computer A to have a variable output. For example, for source S, a Hewlett Packard Model HP 6032A can be used, and for source I, a Hewlett Packard HP 6050B can be used. The current path to one of the battery terminals, here shown as the positive one, from sources S and I is through two relays D and H connected in series. The relays are under the control of the computer A through system B. The current supply circuit also includes a protective diode G in series between the common outputs of current sources S and I to protect the power supply S from any reverse current from the battery.

The signal conditioning system B is a unit having a data input portion and a control portion that is connected to the computer A for bi-directional communication. Unit B has a relay control module to provide signals to control the opening and closure of the contacts of relays D and H. Unit B also includes a voltmeter whose input leads 14 are connected across the battery positive and negative terminals to measure its voltage during charging, discharging and open circuit (no charge or discharge) conditions.

Unit B receives temperature data over line 13 from the battery thermocouple 12. It also measures current in the battery charge/discharge circuit by measuring the voltage across a shunt E. The measured voltage, current and temperature, each an analog quantity, are converted to digital form by an analog-to-digital converter (ADC) module in unit B, and the digital data is supplied to computer A. Unit B also includes a digital-to-analog converter (DAC) to produce, from the digital signals supplied by the computer A, analog control signals on line 21 to control the variable output of current source S.

Unit B performs several control tasks. One is to control relay H by applying a contact closure signal over line 19 to switch between charge and discharge functions for the battery. This is described below. Another is to control relay D by applying a contact closure control signal over line 17 to switch the battery in and out of the circuit. During charging and analysis of the battery F, the relay D is closed. When relay D is open the battery is taken out of the circuit, that is, no charge can be applied. Relays D and H are operated independently of each other. The third control task of Unit B is to program the current provided by the power supply S. This is done by the digital-to-analog converter in the control portion of unit B responding to digital output signals from computer A to produce an analog signal on line 21 to control the current source S output. As described below, the source S is operated to produce steady current flow, pulse current flow and a varying ramp type current flow that increases and decreases between two values. The method and system for performing the diagnostic of the battery are under the control of the application program of computer A, which operates to automatically perform the entire diagnostic testing of a battery F through the use of the computer A and data acquisition and output control portions of unit B. The computer controls the entire charge/discharge, diagnostic testing and repair of the battery. The operation of the system and method of analysis are described with reference to the flow chart diagram of FIGS. 5A–5B.

FIGS. 2–4 illustrate an arrangement for interfacing the system with an unsealed battery being tested to provide access to individual cells of the battery. FIG. 2 is a top view in schematic form of a battery 100 of the type to be monitored by the subject invention, this being a Ni—Cd battery.

The battery is unsealed, that is its top cover has been removed or has not been applied. The battery has a number of cells, shown by the rectangular sections 112. Each cell contains the Ni—Cd components (not shown) in the space within the rectangle. The circles 114 represent the cell vents. Each cell has a typical output voltage of 1.26 volts. The cells 112 are electrically connected by connectors 116 in the manner needed to achieve the desired battery voltage output and capacity. The battery also has the usual positive and negative terminals (not shown), and the overall battery voltage, i.e., with all of the cells connected, is measured across these terminals.

FIG. 3 shows a HAT 120 that is to be placed over the top of the unsealed battery to make electrical contact with each of the cells so that each cell voltage can be measured on an individual basis. The HAT 120 includes a plate 122 of insulated material, such as PLEXIGLASS, on which are mounted a plurality of contact terminals 124 which are to provide the electrical contact. As shown in FIG. 4, each terminal 124 includes an elongated coil spring 126 having a rigid pointed pin contact 128 at its lower end. In using the HAT 120, the plate 122 is aligned with the top of the battery, as shown in FIG. 3, and lowered. The HAT 120 can be held on the battery top by its own weight or a suitable clamping or weighting device (not shown). The pin contacts 128 of the HAT terminals 124 make electrical contact with the connectors 116 of selected cells of the battery 100 depending on the placement of the terminals 124 on plate 122. In general, two adjacent terminals 124 make electrical contact with two of the connectors 116 to provide access to a cell to measure its voltage.

External electrical connection is made to a terminal 124 by attaching a connector, such as of the clip type, at the end of a sensing wire (not shown) onto a part 127 of the coil spring 126 between two nuts 129. The output connections to the terminals 124 have sense wires W which are the inputs to the data input module part of unit B of FIG. 1. Several of the sense wires W are shown in FIG. 3 and there normally would be one for each HAT terminal 124 that is to make contact with a cell connector 116. In running the procedure to analyze a battery, the plurality of sense wires W connect the HAT terminals 124 to the data input module B which contains a suitable electronic multiplexer or mechanical switching device operated by the computer A. The multiplexer selectively connects the HAT terminals 124 of individual cells to the module B voltmeter as directed by the computer A for individually measuring the voltage of the cells. The overall battery voltage also can be measured by accessing the appropriate sense wires from the HAT.

Different battery HATs are designed to accommodate various battery sizes and configurations. As explained below, if no HAT apparatus which matches a specific battery is available, the portion of the diagnostic which makes use of the HAT is skipped. However, by not using the HAT, a significant amount of the automatic battery analysis work will also be skipped.

Figures 5, 5A:
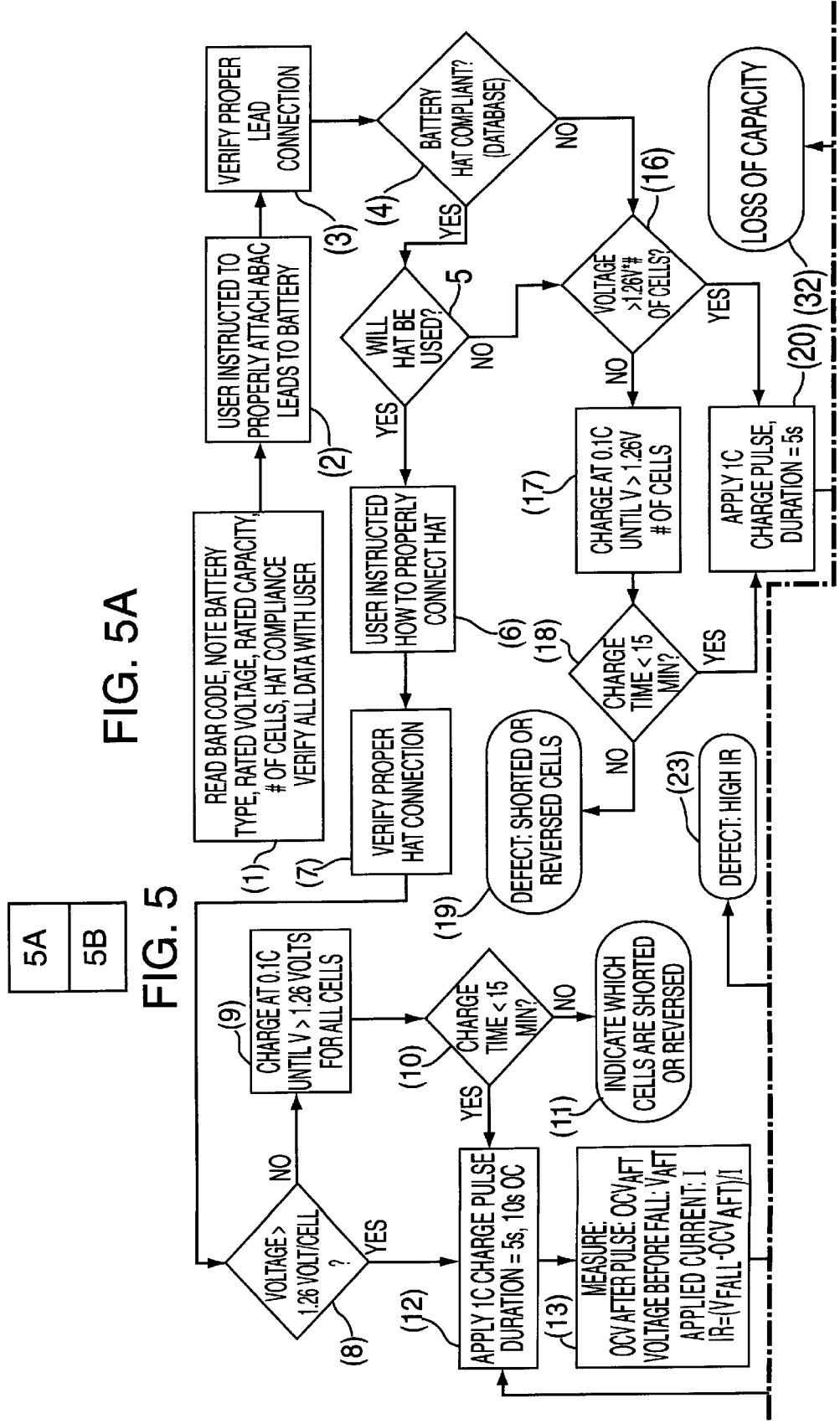
FIGS. 5A and 5B taken together provide a flow chart of the diagnostic procedure.
Figure 5B:
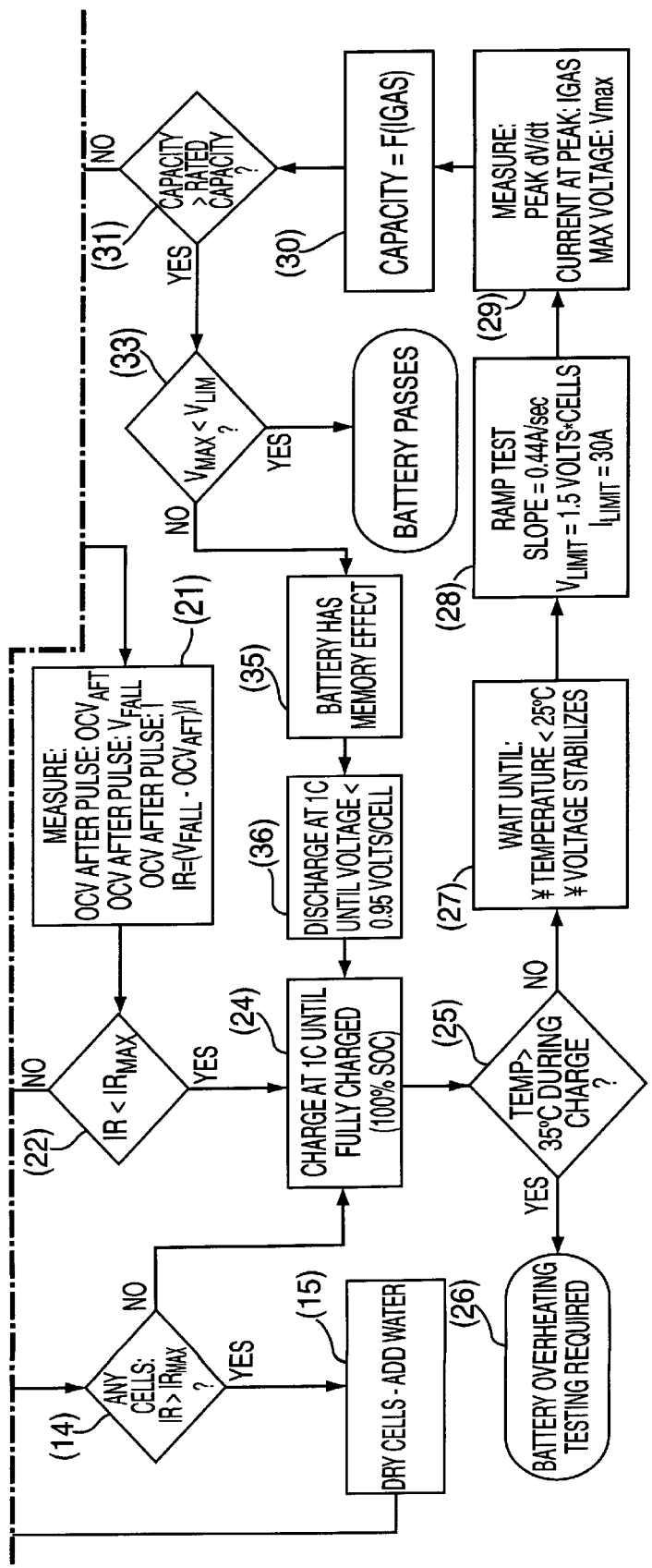

FIGS. 5A–5B taken together are a flow chart representation of the operation of the method and system. In step (1) the system first identifies the battery to be analyzed either by a bar code reader system, that is, the battery can have a bar code data on an outer surface, or through user input to computer A. Characteristics of various types of batteries are stored in the memory of computer A. These include the battery type, rated voltage, rated capacity C, number of cells, HAT compliance, i.e., if a HAT is available, overall battery internal resistance and individual cell internal resistance characteristics for a HAT compliant battery. Upon identification of the battery being tested, the corresponding set of characteristics and test procedures are called up in the computer, and an indication is given as to whether a HAT is available for that battery.

In step (2) the user is instructed, such as by a visual display, to attach the battery to the charge/discharge system of FIG. 1. This basically refers to connection of leads from takeoff points of the shunt E to unit B and leads to diode G and the battery positive and negative terminals so that the current source S and discharge load I can be placed in circuit with the battery. It also includes connecting voltmeter leads 14 from Unit B to the battery positive and negative terminals. Proper connection is confirmed in step (3) by monitoring the battery for a voltage measurement by the Unit B voltmeter of greater than 0V. If a negative voltage (V<0) is measured, the user is instructed to reverse the leads to the battery. The diagnostic continues only after correct battery connection is confirmed.

In the next several steps the system looks for defects that are all cell specific. Such defects include reversed or shorted cells, and battery loss of electrolyte (water). The following describes how these defects can be tested for by two different methods. The first method is to analyze the battery as a whole, whereby defects will be detected, but cannot be specified to the cell level. This results in providing the ability to detect bad batteries, but not to detect for specific defective cells. Thus, in the first method, individual defective cells cannot be identified for subsequent repair or replacement. The second method is to analyze each individual cell, thereby allowing for the detection and repair of defects specific to each problematic cell. The battery HAT permits the second method of analysis to be accomplished in a quick and accurate manner. The HAT also allows measurement of all cell voltages simultaneously, allowing for a comprehensive automated cell analysis.

It is first determined in step (4) if a HAT is available that matches the battery under test or if the battery is not HAT compliant, i.e., there is no HAT that matches the battery. This can be done by using the battery identity data acquired in step (1) and comparing to it a list of HAT compliant batteries stored in the computer. Even if the battery is HAT compliant, upon request in step (5) the user can decline using the HAT and the program will proceed into a non-HAT testing format. Otherwise, for a HAT compliant battery, in step (6) the user is instructed to attach the correct battery HAT to the unsealed (open top) Ni—Cd battery.

The HAT 120 is illustratively shown in FIG. 1 associated with the battery F. Also shown are a plurality of sense wires W from the HAT to the multiplexer (not shown) of the data input section of unit B. Proper HAT connection is verified in step (7) by comparing the value of the sum of the individual cell measured voltage values, obtained by scanning the connectors 124 of HAT 120, with the value of the overall battery voltage measured across the battery + and − terminals. If the measured values do not concur, the user is instructed to re-attach the HAT properly.

HAT Testing Format:

For an unsealed battery being analyzed with the HAT properly connected, the battery is first tested in step (8) for shorted or reversed cells. As a result of deep discharge and battery wear, individual battery cells may develop a condition whereby the cell voltage reverses or drops to 0V. This may be a temporary condition which will correct itself through a slow charge or may be a permanent condition which must be repaired before allowing the battery to return to service. Testing for shorted or reversed cells requires measuring all individual cell voltages through the HAT. Here the computer directs selective scanning of the sense wires connected to the various HAT terminals to monitor the voltage of the cells being tested.

For the battery to be healthy, each cell voltage must exceed 1.26V. If any cell voltage is less than 1.26V, the battery is subjected in step (9) to a C/10 Amp charge from supply S for a predetermined time, for example, a maximum of 15 minutes. The term "C" is the capacity of the battery, rated in Amp*Hours. To accomplish this, computer A closes relay D and maintains relay H in the position shown in FIG. 1. The voltages of the cells are monitored during this time. Charging is carried out in step (10) for the desired predetermined time, as timed by the computer and the cell voltages are again checked. If after this time the voltage of any cell still remains below 1.26V, that cell is defective and must be replaced. Again, each of the battery cells is tested individually and any cell found to be defective is replaced.

If after the charging of step (9) all cells reach at least 1.26V, then all cells are good, and the system continues onto electrolyte level testing starting in step (12). If defects are detected, the system indicates in step (11) which cells are shorted (0V) or reversed (a negative voltage). This information is developed by the computer as it monitors the individual cells. Upon detection of cells being shorted or reversed, further testing is halted for repairs to be made.

Ni—Cd batteries commonly suffer from water (electrolyte) loss, due to electrolysis resulting from overcharging. With the loss of water, the effective plate area affected by the electrolyte is reduced, thus reducing the effectiveness and operability of the battery. With the individual cells accessible, this defect can be diagnosed and also can be repaired by adding distilled water into an opened cell. Analysis for low electrolyte level is accomplished by measuring the internal resistance (IR) of each individual Ni—Cd cell of the battery.

A technique for testing the IR of a cell is described in copending application Ser. No. 09/378,256 entitled "Method for Determining Amount of Water to be Added to a Ni—Cd Cell", which is owned by the assignee of the subject application and incorporated herein in its entirety by reference. This is generally described below. To determine the IR of each cell, measurements are made by the computer controlling the relays D and H and current supply source S in step (12) to apply a current amplitude pulse of 1C, one times the battery capacity C, to the entire battery (across its + and − terminals) while monitoring the voltage response of each individual cell through the HAT and data acquisition apparatus of unit B. The duration of the pulse is typically about 5.0 seconds although other pulse durations can be used. In step (13) the IR of each cell is calculated by the computer as the dV/dI on the falling edge of the applied current charge pulse. That is, the instantaneous rate of change of both the current and the voltage response on the falling edge of the current pulse is calculated. This is accomplished by the computer receiving inputs through the HAT and the data acquisition portion of unit B.

Another way of obtaining IR is by the calculation $$IR = (V_{FALL} - OCVAFT)/I$$

where:

$V_{FALL}$ is the voltage of the cell before the fall of the current pulse $OCV_{AFT}$ is the OCV (open circuit voltage) of the cell after the current pulse, and I is the applied current value The IR of a healthy cell must be below a certain limit, $IR_{MAX}$, depending on battery size. The maximum IR for each of the cells of the battery under test is known from data stored in the computer. Analysis as to whether a cell has an IR that exceeds the $IR_{MAX}$ limit is determined in step (14). This analysis is done for each cell being tested. If the cell IR exceeds the $IR_{MAX}$ limit, an indication is given in step (15) that water must be added to the cell. The amount of water that must be added to a cell corresponds to how far the computed IR exceeds the $IR_{MAX}$ limit set for that cell size. Exact water addition amounts as related to IR values, and other additional details of the water addition process, are described in the aforesaid prior application.

The testing and water addition procedures of steps (12–15) are repeated until all cells meet the requirement for sufficient water content as indicated by the cell IR being less than its $IR_{MAX}$ value. At this point HAT testing is completed, and all other diagnostics involve testing the battery as a whole, rather than its individual cells. From this point, all batteries, both of the sealed or unsealed type and whether or not HAT compliant, undergo the same remaining test/charge steps in the procedure.

Non-HAT Testing Format

The "non-HAT" portion of the diagnostic mirrors the HAT testing described above. In this portion the system tests for shorted or reversed cells, but does so without the ability to narrow down defects to specific cells. Defects are detected in relation to the battery as a whole. That is, the battery inputs to the diagnostic system are only from its positive and negative terminals and cells cannot be addressed individually.

In step (16) overall battery voltage is initially measured. The voltage must be greater than 1.26V multiplied by the number of cells, or groups of cells, connected in series in order to rule out any shorted or reversed cell defects. A single defective cell will result in the battery not having its normal nominal overall output voltage, that is, 1.26V times the number of cells connected in series. If the initial voltage measurement is below this minimum voltage, in step (17) the computer initiates a C10 Amp charge from source S to the battery for a maximum predetermined time, for example, 15 minutes, or until the overall battery voltage reaches a value of 1.26V multiplied by the number of series connected cells. If after the predetermined charge time, as determined in step (18), this minimum voltage is not reached, this indicates that the battery contains one or more shorted or reversed cells. The user is informed of the defect and the system halts testing in step (19). If the battery voltage exceeds the minimum nominal output voltage cutoff, either on initial measurement in step (16) or as a result of the C/10 Amp charge in step (17), then all of the cells of the battery are healthy in this respect and further testing continues.

A battery that passes the minimum voltage test of step (16) is then tested for low electrolyte by measuring the overall battery IR. The computer data for the battery under test includes a maximum overall battery IR, designated as $IR_{OMAX}$ to distinguish from the $IR_{MAX}$ of a cell. A high overall battery IR of $IR > IR_{OMAX}$ would indicate a condition of one or more poor cells, most likely as a result of loss of water from cells due to electrolysis.

The battery overall IR is measured by applying a C/10 Amp pulse to the battery in step (20) across its positive and negative terminals, and monitoring the output overall voltage in step (21). This is similar to the individual cell test of step (13) for obtaining the IR of a cell. The battery overall IR value is calculated in step (21) as the dV/dI value on the falling edge of the current pulse, as described above.

The overall battery $IR_{OMAX}$ limits are designated in the computer for different sized batteries. The $IR_{OMAX}$ value is thus available for the particular battery being tested. If the IR $> IR_{OMAX}$ condition is determined to exist for the particular battery being tested, then the battery has one or more defective cells and must be taken out of service until repaired. This is indicated in step (23). Individual cell analysis is required to locate and repair defective cells. That is, the battery must be unsealed so that testing of all cells can be accomplished on an individual basis. Otherwise, the entire battery is considered as defective.

If the overall battery IR is within the specified limits $IR < IR_{OMAX}$, the battery passes this test and the test process continues in step (24) with universal (HAT and non-HAT) testing. That is, batteries whose individual cells have been tested by the HAT procedure of steps (12–14) and batteries that were non-HAT tested on an overall determination of battery IR of steps (16–20), are both subjected to the same remaining procedures. Both HAT compliant and non-HAT compliant batteries are herein treated on an overall basis.

The remainder of the test procedure beginning at step (24) involves testing at a fully charged state (100% SOC). In step (24) the computer operates to charge the battery at a rate of C/10 Amps, during which time its temperature is monitored in step (25) by the thermocouple 12. If the temperature exceeds 35° Centigrade, a value programmed into the computer, in step (26) the charge is halted and the user is notified that the battery has overheated. The battery voltage is continually monitored during the time the battery is being charged. The charge of step (24) continues until a voltage drop of a certain value, typically 15mV, is measured in the response voltage. This indicates that the battery has been fully charged, i.e., has a 100% state of charge (SOC). Other values of mV drop can be used, although 15mV is preferable. The 15mV voltage drop is measured by computer A over consecutive data points, without detecting any voltage rises in the interim. However, charging is stopped after detection of the 15mV drops from the maximum measured voltage. Any further charging after detection of the 15mV drop would do more to damage the battery than to charge it.

After discontinuing the charge of a battery whose temperature is less than 35° C. during the charge such battery is allowed to rest in a fully charged state in step (27), until it stabilizes with respect to voltage and temperature. Battery temperature must drop below 25° C. The voltage of a battery configured with a number of cells connected in series to have a certain nominal rated output voltage will typically reach a higher voltage during the charge and must be permitted to stabilize and drop back to the nominal rated output voltage. The voltage should drop back to the battery nominal rated output at a reasonable rate. For example, for a Ni—Cd battery with nineteen cells connected in series, the voltage drop rate is less than 2mV/min.

Once the battery has stabilized, in step (28) the computer applies a current ramp from source S to the battery, beginning at 0 A. The current is increased at a constant rate, for example, 0.44 A/sec, until either the current amplitude reaches 30 A, or the battery voltage reaches a predetermined voltage, for example 1.5V multiplied by the number of cells. The current is then ramped back down to 0 A at the same, but negative, slope. The results from this test are used for the final battery diagnostics.

During the current ramp test the data analysis acquisition system computer A and unit B continually monitor and record the applied current and response voltage, as shown in step (29). Using the data from the ramp test of step (28), the system calculates the existing present actual capacity of the battery in step (30). The details for the calculation of the existing capacity, which is different from the rated capacity C, are described in the aforementioned patent application. The basic methodology is to measure the maximum current ($I_{MAX}$) reached during the ramp test. The battery's existing capacity is then determined as a function of $I_{MAX}$. This can be a point at which a gas reaction occurs in the battery in response to the ramp current. The system then compares the battery calculated existing capacity with the rated capacity C in step (31), the rated capacity C value having been stored in the memory of computer A. If the calculated existing capacity is less than the rated capacity C, the system indicates in step (32) that the battery has suffered a loss of capacity. Otherwise, it continues on to a stage of memory effect testing.

A defect that commonly affects Ni—Cd batteries is the memory effect. This results from repeatedly discharging a battery to a given level other than 0% SOC. The battery will eventually perform as if this higher discharge level is really 0% SOC, thereby reducing its effective capacity. The system is able to determine, based on the results of the above ramp test of step (28), whether the battery is stricken with the memory effect. For details of the method for determining whether a battery is stricken with memory effect, reference is made to the co-pending application Ser. No. 09/1 53,401, filed Sep. 15, 1998, entitled "Apparatus and Method for Detecting Memory Effect in Nickel-Cadmium Batteries", which is owned by the assignee of the subject application and whose disclosure is incorporated herein by reference. The system in step (33) compares the maximum battery voltage $V_{MAX}$ measured during the entire current ramp cycle with a predetermined voltage limit $V_{LIM}$ that corresponds to the battery under test as stored in the computer. If the voltage limit is exceeded, the battery is diagnosed in step (35) as suffering from the memory effect.

If the battery is stricken with memory effect, in step (36) it is discharged at a 1C rate until the voltage reaches a given value, such as 0.95 Volts/cell. The discharge is accomplished by operating relay H to place the electronic load I in the circuit and to disconnect source S. At this point of discharge the battery should be sufficiently recovered from the memory effect. The relays D and H are operated to remove load I and place source S in the circuit. The battery is then recharged to 100% SOC as before in step (24). After this, the system retests the battery in its fully charged state (100% SOC). If no memory effect is observed, the battery has passed the diagnostic testing, and is ready to be returned to service.

The methodology described above utilizes several different steps to diagnose the health of a battery. Several of the steps involve testing for different defects. In addition to the steps themselves, the sequence through which they are taken, as shown in FIG. 5, is also important for properly determining the health of a Ni—Cd battery.

Example:

A 30AH Nickel-Cadmium unsealed aircraft battery was used as a test subject. The analysis was run through a computer interface. For test purposes, battery data was input manually, rather than through a bar code reader. Therefore, the system requested battery data, which was subsequently input. The user was instructed to attach battery cables (Step 2 of FIG. 5). Cables were attached properly, and confirmed by the system (Step (3)). Recognizing that a HAT existed (Step 4) for the 30AH aircraft battery, the system asked (Step 5) if the battery HAT would be used. After affirmings, the user was instructed (Step 6) to attach the HAT. The HAT was intentionally attached incorrectly, and detected by the diagnostic (Step 7), which requested that the HAT be reattached properly. After reattaching the HAT correctly, the system measured cell voltages (Step 8), and found several voltages blow 1.26V, and proceeded to apply (Step 9) a 0.1 Amp charger for several minutes. After charging, all voltages reached 1.26V, and the system applied Step 12) the 1C Amp charge pulse. The IR vs. $IR_{MAX}$ was determined by the computer for each cell (Step 13) and (Step 14) and low electrolyte messages were presented (Step 15) to the user for the appropriate cells whose IR>IRmax. The battery HAT was removed, and water was added to several cells. Additional amounts to be added were specified by the system. The following amounts were added:

| Cell | Water Added (mL) |
|------|------------------|
| 1    | 3                |
| 3    | 6                |
| 6    | 3                |
| 9    | 6                |
| 12   | 6                |
| 14   | 3                |
| 15   | 6                |
| 16   | 3                |
| 17   | 6                |
| 18   | 6                |
| 19   | 3                |

The user informed the system that all water had been added (Step 15). The system then waited 15 minutes after which the 1C Amp charge pulse was reapplied (Step 12). The IR value for each cell was measured (Step 13) and all were found to be below the $IR_{MAX}$ limit. The system proceeded to the next step (24), which is fully charging the battery. The battery was charged at 1CA rate) until 100%

SOC, after which the charge was stopped, and the battery remained in open circuit for 2 hours. No overheating was detected during charge. After stabilizing, a ramp test was applied to the battery. The system then indicated that the battery capacity was 42Ah, and had passed the diagnostic tests. No defects remained in the battery.

While the invention has been particularly shown and described with reference to preferred embodiments thereof, it will be understood by those skilled in the art that various changes in form and details may be made therein without departing from the spirit and scope of the invention.

We claim:

1. A system for analyzing a multi-cell battery on either an individual cell level basis or overall battery basis comprising:

means for testing whether one or more cells are shorted or reversed;

means for testing individual cells for sufficient electrolyte; and means for testing the battery for overall internal resistance (IR) to determine if the battery overall IR exceeds a given maximum value internal resistance which indicates that the battery is defective.

2. A system as in claim 1 further comprising:

means for determining the actual capacity of each of a battery tested on an individual cell level basis whose cells are not shorted or reversed and have sufficient electrolyte, and a battery tested on an overall basis whose overall IR is less than said given maximum value internal resistance.

3. A system as in claim 2 further comprising means for testing a battery whose actual capacity is greater than its rated capacity for a memory effect and correcting for the memory effect.

4. A system as in claim 1 wherein said means for testing for shorted or reversed cells of a battery analyzed on a cell level basis comprises means for measuring the voltage of the battery individual cells to determine if each is equal to or greater than a first value and of a battery analyzed on an overall battery level basis by measuring the overall battery voltage to be equal to said first value times the number of cells of the battery connected in series.

5. A system as in claim 1 wherein said means for testing said individual cells for sufficient electrolyte comprises means for measuring the cell internal resistance and determining if it is greater than a predetermined maximum internal resistance of the cell which indicates that the cell needs electrolyte.

6. A system as in claim 2 wherein said means for testing for overall battery actual capacity comprises means for applying a positive and negative slope ramp charging current to the battery and determining at which point the battery voltage (V) response has a peak dv/dt.

7. A system as in claim 3 wherein said means for testing for memory effect and correcting comprises means for discharging the battery to have an overall voltage less than a predetermined voltage per cell times the number of cells connected in series, and then recharging the battery.

8. A system as in claim 1 further comprising means for determining if a battery is to be tested on a cell level basis or overall battery level basis.

9. A system as in claim 8 further comprising a connecting device to make electrical contact with each of the cells to be tested for a battery to be tested on a cell level basis.

10. A method for comprehensive analysis of a multi-cell battery, on an individual cell level basis for an unsealed battery which affords access to the individual battery cells and an overall battery level basis for both an unsealed and a sealed battery, comprising:

for an unsealed battery,
(a) determining the presence of any shorted or reversed cells and repairing or replacing such cells, testing the individual cells for sufficient electrolyte and adding electrolyte as needed, for a sealed battery, to which there is no access to the individual cells, testing for shorted or reversed cells on a battery level basis;

subjecting both a sealed battery found to have no shorted or reversed cells and an unsealed battery whose individual cells have been found to be satisfactory in its prior tests (a) and (b) to further testing on a battery level basis by (c) determining if the battery overall internal resistance exceeds a given maximum value internal resistance, this indicating that the battery is defective, (d) determining the actual capacity of a battery whose overall internal resistance is determined in step (c) to be less than said given maximum value internal resistance and comparing the actual capacity to the battery rated capacity, e) testing a battery whose actual capacity is less than its rated capacity for a memory effect, and (f) correcting the memory effect problem if found to be present in step (e).

11. The method of claim 10 wherein said battery is a nickel-cadmium battery.

12. The method of claim 10 wherein said step of determining the presence of sufficient electrolyte in a cell comprises comparing the cell internal resistance to a maximum internal resistance for the cell.

13. The method as in claim 10 wherein said step of determining the presence of shorted or reversed cells of a battery analyzed on a cell level basis comprises measuring the voltage of the battery individual cells to determine if each is equal to or greater than a first value and of a battery analyzed on an overall battery level basis by measuring the overall battery voltage to be equal to said first value times the number of cells of the battery connected in series.

14. The method of claim 10 wherein said step of determining overall battery actual capacity comprises applying a positive and negative slope ramp charging current to the battery and determining at which point the battery voltage (V) response has a peak dv/dt.

15. The method of claim 10 wherein said steps of testing for memory effect and correcting comprises discharging the battery to have an overall voltage less than a predetermined voltage per cell times the number of cells connected in series, and then recharging the battery.

* * * * *